(12) United States Patent
Kuo et al.

(10) Patent No.: US 12,369,406 B2
(45) Date of Patent: *Jul. 22, 2025

(54) ELECTROSTATIC DISCHARGE PROTECTION FOR INTEGRATED CIRCUIT DURING BACK END-OF-LINE PROCESSING

(71) Applicant: Taiwan Semiconductor Manufacturing Company LTD, Hsinchu (TW)

(72) Inventors: Hsi-Yu Kuo, Hsinchu (TW); Tsung-Yuan Chen, Hsinchu (TW); Yu-Lin Chu, Hsinchu (TW); Chih-Wei Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 107 days.

This patent is subject to a terminal disclaimer.

(21) Appl. No.: 18/228,241

(22) Filed: Jul. 31, 2023

(65) Prior Publication Data

US 2023/0378162 A1 Nov. 23, 2023

Related U.S. Application Data

(63) Continuation of application No. 17/582,503, filed on Jan. 24, 2022, now Pat. No. 11,764,206.

(60) Provisional application No. 63/280,214, filed on Nov. 17, 2021.

(51) Int. Cl.
*H10D 89/60* (2025.01)
*H01L 25/065* (2023.01)
*H02H 9/04* (2006.01)

(52) U.S. Cl.
CPC .......... *H10D 89/60* (2025.01); *H01L 25/065* (2013.01); *H02H 9/046* (2013.01)

(58) Field of Classification Search
CPC ....... H10D 89/60; H01L 25/065; H02H 9/046
See application file for complete search history.

(56) References Cited

U.S. PATENT DOCUMENTS 6,011,681 A * 1/2000 Ker ................... H10D 89/601
361/111
7,245,467 B2 * 7/2007 Yeh ..................... H01L 27/0259
361/56

(Continued)

*Primary Examiner* — Scott Bauer
(74) *Attorney, Agent, or Firm* — Lippes Mathias LLP

(57) ABSTRACT

In an integrated circuit (IC) fabrication process, devices or sub-circuits are fabricated in respective first and second electrical isolation regions. A back-to-back (B2B) diodes sub-circuit is fabricated in a third electrical isolation region, which includes a first diode whose cathode is connected with a first terminal and whose anode is connected with a second terminal, and a second diode whose anode is connected with the first terminal and whose cathode is connected with the second terminal. Electrostatic discharge protection is provided to the first and second electrical isolation regions by electrically connecting the first terminal of the B2B diodes sub-circuit with a VSS power supply terminal of the first device or sub-circuit and the second terminal of the B2B diodes sub-circuit with a VSS power supply terminal of the second device or sub-circuit. Thereafter, the first device or sub-circuit and the second device or sub-circuit are electrically connected.

20 Claims, 14 Drawing Sheets

(56) References Cited

U.S. PATENT DOCUMENTS

| | | | |
|---|---|---|---|
| 7,746,606 B2* | 6/2010 | Worley | H10D 89/601 |
| | | | 361/91.1 |
| 8,217,494 B2* | 7/2012 | Chen | H01L 23/60 |
| | | | 257/E29.174 |
| 2005/0073006 A1* | 4/2005 | Pequignot | H10D 89/611 |
| | | | 257/355 |
| 2013/0082353 A1* | 4/2013 | Kuo | H10D 89/711 |
| | | | 257/E29.174 |
| 2016/0276332 A1* | 9/2016 | Laine | H01L 27/0251 |
| 2019/0103396 A1* | 4/2019 | Zhan | H10D 62/137 |
| 2020/0381424 A1* | 12/2020 | Shukla | H01L 23/49562 |

* cited by examiner

ELECTROSTATIC DISCHARGE PROTECTION FOR INTEGRATED CIRCUIT DURING BACK END-OF-LINE PROCESSING

This application is a continuation of U.S. Ser. No. 17/582,503 filed Jan. 24, 2022 and since issued as U.S. Pat. No. 11,764,206, which claims the benefit of U.S. provisional application Ser. No. 63/280,214 filed Nov. 17, 2021 and titled "Novel Dis-Charge Sub-circuit Structure and Method". U.S. provisional application Ser. No. 63/280,214 filed Nov. 17, 2021 and titled "Novel Dis-Charge Sub-circuit Structure and Method" is incorporated herein by reference in its entirety.

BACKGROUND

The following relates to integrated circuit (IC) arts, IC fabrication arts, electrostatic discharge (ESD) protection arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A depicts the IC-under-fabrication after front end-of-line (FEOL) processing. FIG. 1B depicts the IC-under-fabrication after deposition and patterning of a first metallization layer during back end-of-line (BEOL) processing. FIG. 1C depicts the IC-under-fabrication after deposition and patterning of a second metallization layer during the BEOL processing.

DETAILED DESCRIPTION

Figure 1A:
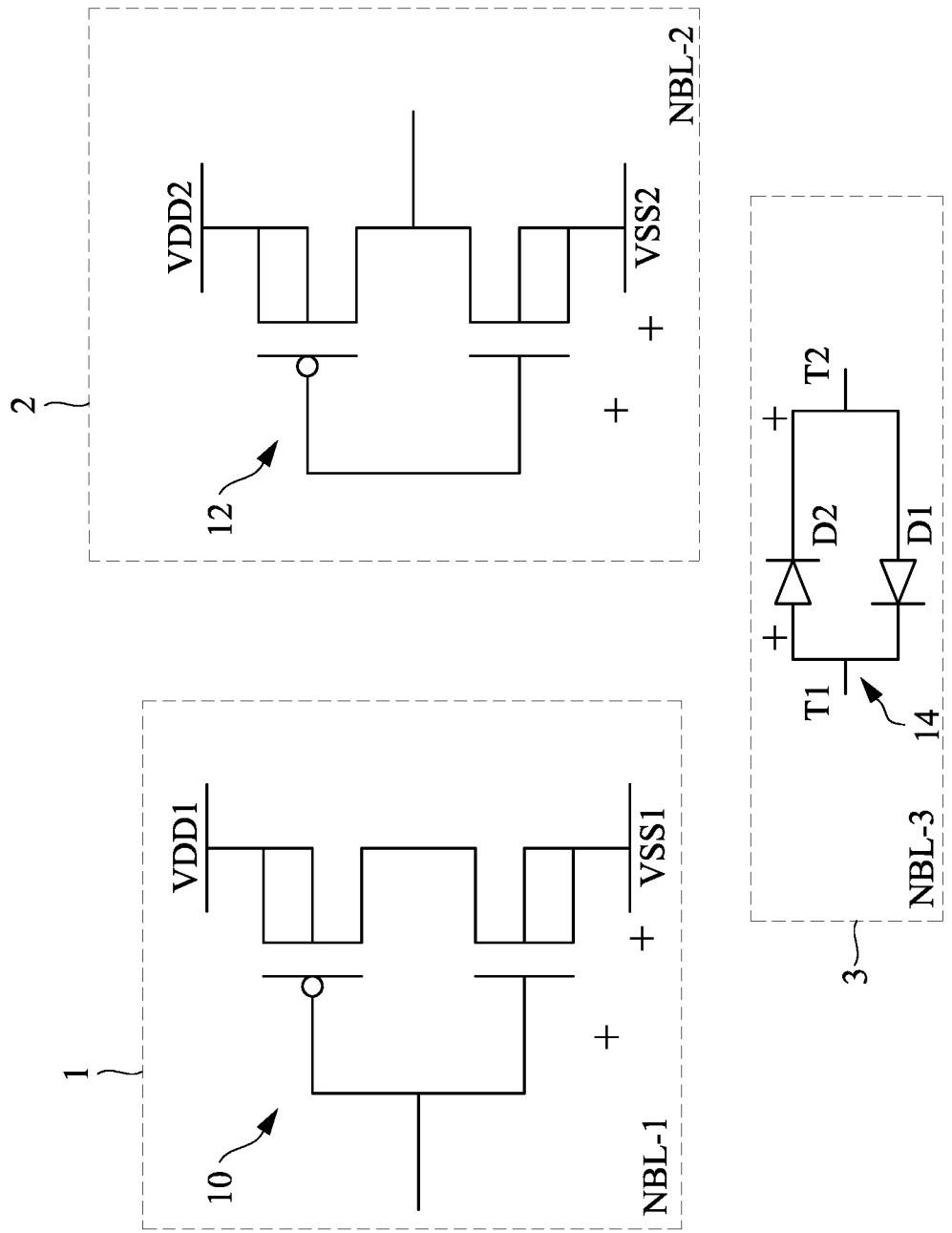
FIGS. 1A, 1B, and 1C diagrammatically illustrate an IC fabrication process by way of circuit diagrams.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following, embodiments are disclosed for preventing damage to devices or sub-circuits of an IC under fabrication which are disposed in different electrical isolation regions due to transfer of static electrical charge between the electrical isolation regions when the devices or sub-circuits in the different electrical isolation regions are electrically connected together during the metallization stage of the integrated circuit (IC) fabrication. In some embodiments, an electrostatic discharge (ESD) protection sub-circuit is formed in a separate electrical isolation region, and the ESD protection sub-circuit is electrically connected between power supply terminals of the same polarity of the two electrical isolation regions (e.g., connected between the $V_{SS}$ power supply terminals of the two electrical isolation regions). This is done prior to connecting the devices or sub-circuits in the different electrical isolation regions with each other. In this way, if static electrical charge has built up in at least one of the electrical isolation regions, then this static electrical charge will be controllably dissipated by the ESD protection sub-circuit when it is connected between the electrical isolation regions, before the direct connection between the two regions is made. To ensure the ESD protection sub-circuit is electrically connected before the connection of the devices or sub-circuits, the connection of the ESD protection sub-circuit with the power supply terminals can be implemented in an earlier metallization layer of back end-of-line (BEOL) metallization processing than the metallization layer that provides the electrical connection between the devices or sub-circuits.

In some more specific embodiments, the ESD protection sub-circuit comprises back-to-back diodes. In some embodiments, the ESD protection sub-circuit and its connection with the $V_{SS}$ power supply terminals of the protected isolation regions remains in the IC after fabrication is complete. However, as recognized herein, this is not problematic because in the completed IC the power supply terminals that are connected by the ESD protection sub-circuit should be at the same electrical potential so that negligible electrical current should flow through the ESD protection sub-circuit during operation of the completed IC.

In the following, rationale for the above solution is described. An IC includes devices such as diodes, field effect transistors (FETs), capacitors, photodiodes, and the like, and sub-circuits comprising electrically interconnected devices. During front end-of-line (FEOL) fabrication processing, the devices of the IC are fabricated on and/or in a common substrate, such as a silicon substrate or variant thereof such as a silicon-on-insulator (SOI) substrate in the case of silicon-based IC technologies. The substrate is also sometimes referred to as a wafer when commercially supplied or grown/cut as round disks in a standard size such as 200 mm diameter or 300 mm diameter wafers. The silicon of the silicon wafer or SOI wafer may in general be doped n-type or p-type. During fabrication, p-type wells and/or n-type wells are electrically isolated by a buried doped layer of the opposite doping type. For example, a p-type well can be electrically isolated by an underlying n-type buried layer (NBL) or deep n-well (DNW) or the like, along with shallow trench isolation (STI), local oxidation of silicon (LOCOS), high-voltage N-well (HVNW), or another lateral isolation structure. Similarly, an n-type well can be electrically isolated by an underlying p-type buried layers (PBL), deep p-well (DPW), or the like, along with STI, LOCOS, high-voltage P-well (HVPW), or the like. Various combinations of p-type wells, n-type wells, NBLs, DNWs PBLs, DPWs, STI, LOCOS, HVNW, HVPW, and/or the like form electrical isolation regions of the IC-under-fabrication within which devices or sub-circuits are fabricated.

The FEOL processing is followed by back end-of-line (BEOL) processing, in which one or (more commonly) several metallization layers embedded in an intermetal dielectric (IMD) are deposited on the wafer. The metallization layers are patterned to form electrically conductive paths or traces, which serve as interconnects between the various devices, connections to IC power supply lines (VDD, VSS), and/or to IC-level signal input or output lines, by lithographical and etching processes. Electrical vias of conductive material are also formed to provide electrical connections to and/or between the formed paths or traces. The BEOL processing may include forming top electrical contact pads for enabling electrical connection to and from outside the IC using wire bonding, flip-chip bonding to solder bumps, or the like. These contact pads may include power supply pads (e.g., $V_{DD}$ and $V_{SS}$ contact pads in FET technologies) and signal input and/or output contact pads.

A problem can arise during the IC fabrication process, in that the electrical isolation regions that can trap static electrical charge. Static electrical charge can be delivered to the electrical isolation regions of the IC-under-fabrication by various mechanisms. For example, many processes such as some types of deposition, photolithography, etching, and so forth are carried out with the wafer placed in a vacuum chamber or other chamber with a controlled ambient that is electrically insulating. In this environment, any static electric charge delivered to the wafer by the deposited material, or by plasma in a plasma etching process, or so forth, can collect in the electrical isolation regions. Even processes forming the isolation structures can introduce static charge. For example, ion implantation processes for forming a buried n-type or p-type layer to provide electrical isolation employs electrically charged ions that can leave residual static charge. Even further, process fluids can develop static electric charge during fluid flow that is then delivered to the wafer when the fluid is applied to the wafer. Such process fluids may include, for example, deionized water (DI), photoresist developer fluids, and so forth. Once trapped, the charge flow barriers that form the electrical isolation region (e.g., NBL, PBL, DNW, DPW, STI, LOCOS, HVNW, HVPW, et cetera) undesirably impede or block dissipation of the accumulated static electrical charge from the isolation region.

During the subsequent BEOL processing, devices and/or sub-circuits that were fabricated in the electrical isolation regions during FEOL processing are electrically interconnected by electrically conductive traces. Such electrical interconnections enable proper operation of the final fabricated IC, and may not be a problem in the final fabricated IC when it is used within its design-basis operational and environmental envelopes because the circuit-level IC design provides for static charge dissipation. For example, the $V_{SS}$ terminal(s) of a FET-technology IC provide paths to electrical ground that can dissipate static electrical charge that might build up in an electrical isolation region.

However, during the BEOL processing, the interconnection of components and sub-circuits is not yet complete, and the IC is not connected to a power supply. This can result in a situation during the BEOL processing in which one electrical isolation region which has developed a large amount of static electrical charge is connected to another electrical isolation region with a substantially lower amount of static electrical charge. When the interconnection is made, this static electrical charge can produce a transient electrical current (referred to as an electrostatic discharge) flowing from the electrical isolation region with higher static electrical charge (the "aggressor" region) to the electrical isolation region with lower electrical charge (the "victim" region). The electrostatic discharge can produce a high enough transient electrical current to damage devices or sub-circuits carrying the transient electrical current.

With reference now to the drawings, some illustrative embodiments are described. In these embodiments, the isolation regions are formed by n-type buried layers (NBLs) and HVNWs for lateral isolation. However, as previously described, the isolation region can in general be either n-type or p-type depending on the technology family and specific IC design, and various mechanisms can be used to electrically isolate the isolation region in place of and/or in addition to the illustrative NBL/HVNW isolation.

Figure 1B:
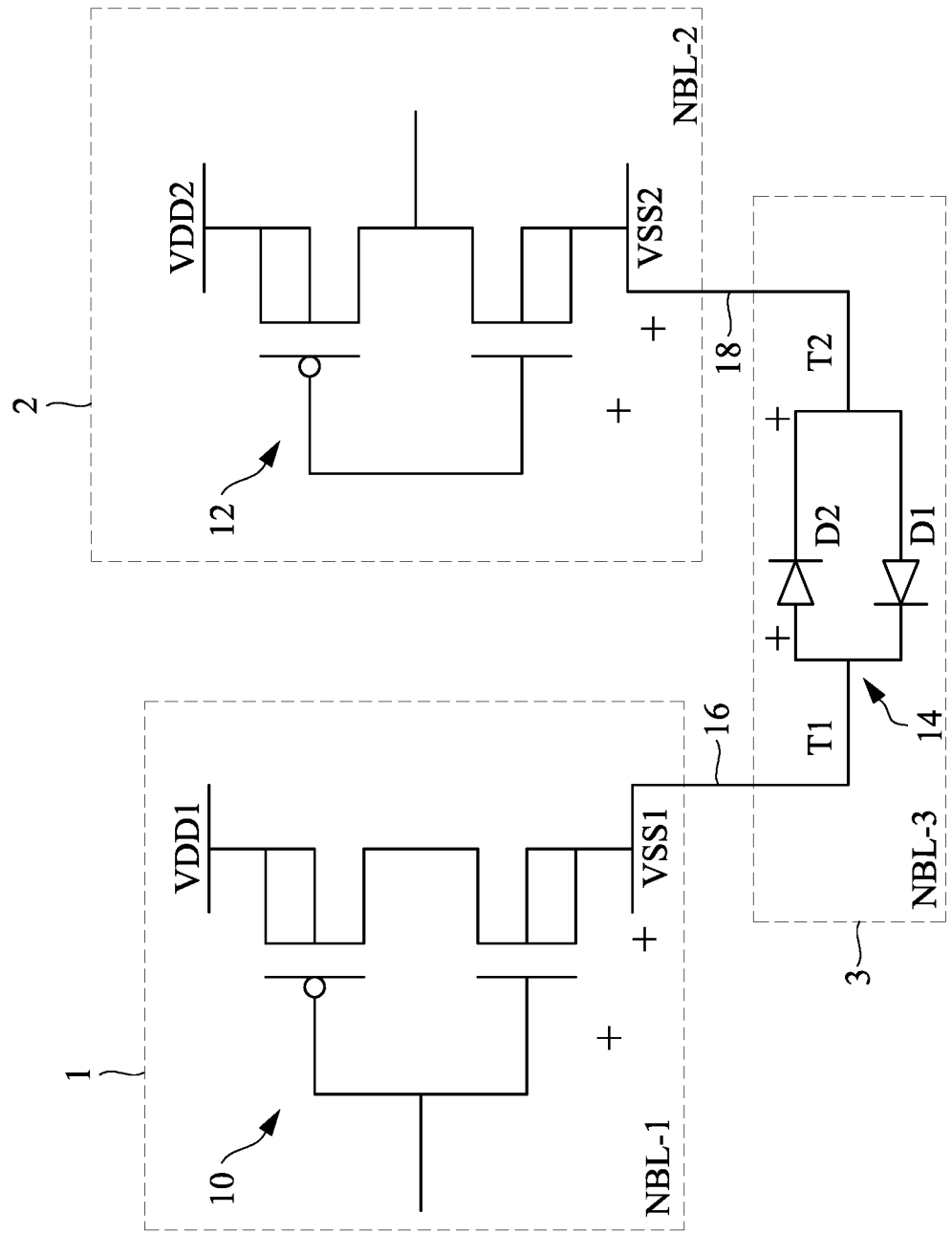
Figure 1C:
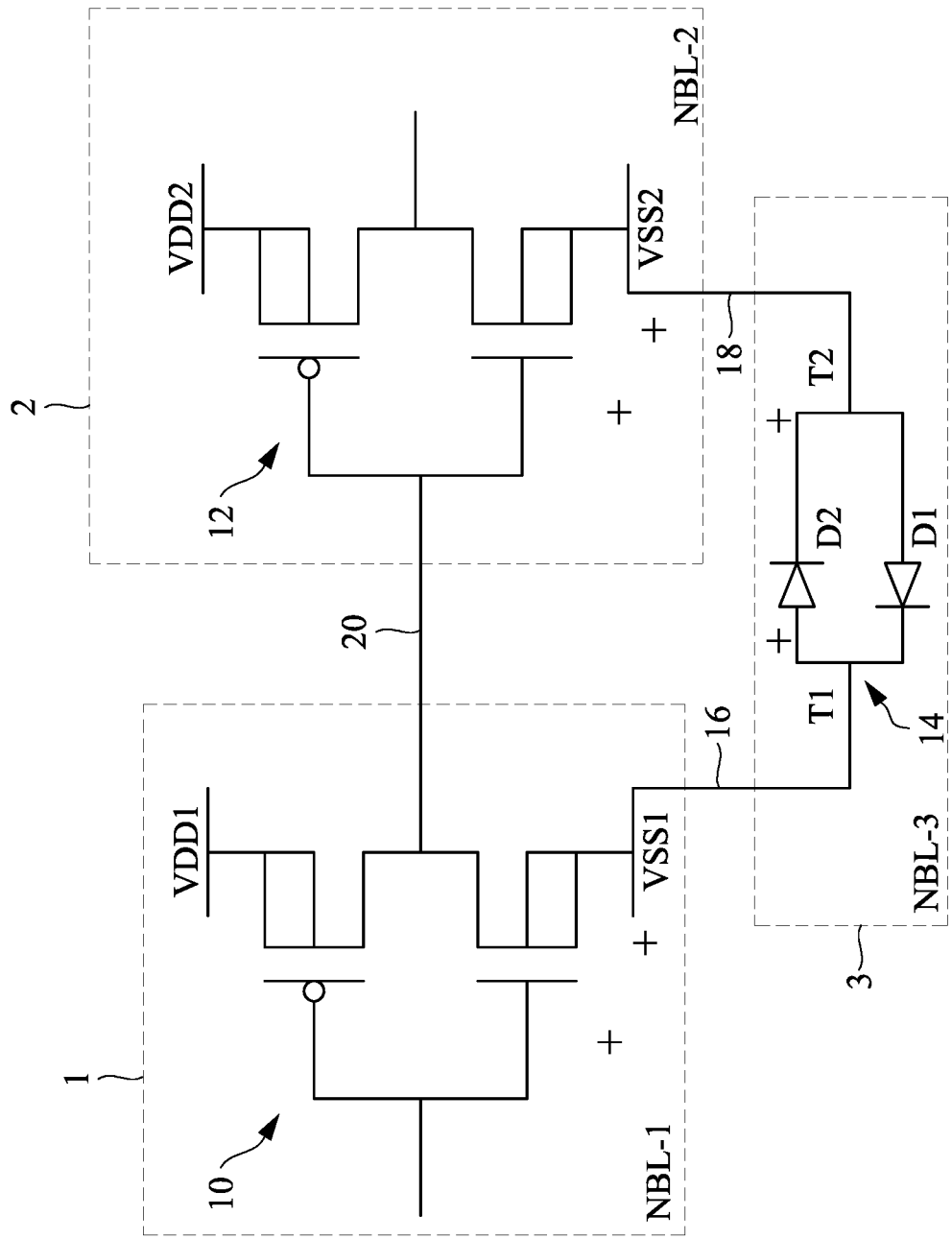

With reference to FIGS. 1A, 1B, and 1C, an example of the disclosed electrostatic protection is shown by way of a circuit diagram. FIG. 1A depicts the IC-under-fabrication after front end-of-line (FEOL) processing. In this processing, a first electrical isolation region 1, a second electrical isolation region 2, and a third electrical isolation region 3, are formed on or in a substrate (not shown, e.g. a silicon or SOI substrate). The illustrative isolation regions 1, 2, and 3 are formed by an NBL as indicated, with the lateral boundary of each isolation region formed by a HVNW or the like. For example, the NBLs can be performed by ion implantation, a sequence of epitaxial layer deposition steps, or the like. The HVNW can similarly be formed by ion implantation or the like. A first device or sub-circuit 10 is formed in the first isolation region 1. A second device or sub-circuit 12 is formed in the second isolation region 2. These devices or sub-circuits can be formed by any suitable fabrication techniques for the IC family of the IC-under-fabrication. The illustrative devices or sub-circuits 10, 12 are CMOS logic inverters with each inverter made up of a pair of interconnected field effect transistors (FETs), which in general can be planar FETs, FinFETs, gate-all-around (GAA) FETs, or so forth. More generally, the first and second devices or sub-circuits can be a single device or a plurality of devices fabricated in the electrical isolation region to form a more complex sub-circuit such as a logic sub-circuit, a charge storage sub-circuit (e.g. a memory), a photodiode, a capacitor, various sub-circuits combining such, and/or so forth.

As further shown in FIG. 1A, the first device or sub-circuit 10 has two power supply terminals, namely VDD1 and VSS1; and likewise the second device or sub-circuit 12 has two power supply terminals, namely VDD2 and VSS2. The power supply terminals are points or regions of the respective device or sub-circuit that, in the final device, will be electrically connected to an electrical power supply. The illustrative CMOS logic inverters belong to the FET IC family, and more particularly to the CMOS IC family. For FET ICs, the power supply typically includes a $V_{DD}$ pin and a $V_{SS}$ pin, and in the final completed IC the power supply terminals VDD1 and VDD2 will be connected to the $V_{DD}$ pin and the power supply terminals VSS1 and VSS2 will be connected to the $V_{SS}$ pin. In standard FET IC design, $V_{DD}$ denotes the positive voltage of the power supply (for example, 5V, 3.3V, 1.8V, 1.2V in some common IC technologies), and $V_{SS}$ denotes the negative voltage (or ground, i.e. 0V) of the power supply. Hence, in the final fabricated IC when operating, the terminals VDD1 and VDD2 will be electrically connected to the $V_{DD}$ pin so as to be held at voltage VDD, and likewise the terminals VSS1 and VSS2 will be electrically connected to the $V_{SS}$ pin so as to be held at voltage $V_{SS}$.

However, during fabrication of the IC, this is not the case, rather, during FEOL processing the electrical isolation regions 1, 2, and 3 are typically electrically isolated, as diagrammatically shown in FIG. 1A, and as such can build up static electrical charge (diagrammatically indicated by "+" signs, although in general the static electrical charge could be either positive charge or negative charge in a given electrical isolation region). As previously noted, the static electrical charge can be delivered to the electrical isolation regions during processes such as material deposition, photolithography, etching, ion implantation, or so forth. If no countermeasure is taken then when the first and second devices or sub-circuits 10, 12 are connected there is a potential for an electrostatic discharge from one device or sub-circuit to the other device or sub-circuit. If the electrical current produced by the electrostatic discharge is large enough, damage to a device or sub-circuit could result.

With continuing reference to FIG. 1A, to mitigate the likelihood of a deleterious electrostatic discharge event during the upcoming BEOL processing, an electrostatic discharge (ESD) protection sub-circuit 14 is formed in the third electrical isolation region 3. In general, the first and second devices or sub-circuits 10, 12 and the ESD protection sub-circuit 14 are formed during FEOL processing. The illustrative ESD protection sub-circuit 14 comprises a back to back (B2B) diodes sub-circuit 14 having a first terminal T1 and a second terminal T. The B2B diodes sub-circuit 14 includes a first diode D1 whose cathode is connected with the first terminal T1 and whose anode is connected with the second terminal T2, and a second diode D2 whose anode is connected with the first terminal T1 and whose cathode is connected with the second terminal T2. While the illustrative ESD protection sub-circuit 14 comprises a B2B diodes sub-circuit, other types of ESD protection sub-circuits are contemplated, such as employing Zener diodes, or a resistor- or transistor-based ESD protection sub-circuit, or so forth.

To summarize, during the FEOL processing the three electrical isolation regions 1, 2, 3 are formed and the first and second devices or sub-circuits 10, 12 and the ESD protection circuit 14 are formed in the respective electrical isolation regions 1, 2, 3. The result of this FEOL processing is diagrammatically shown in FIG. 1A. Thereafter, the BEOL processing is performed.

With reference to FIG. 1B, the ESD protection sub-circuit 14 is electrically connected between the VSS1 terminal of the first device or sub-circuit 10 and the VSS2 terminal of the second device or sub-circuit 12. This can be done as a metallization layer deposition and patterning step of the BEOL processing. In the illustrative example of FIG. 1B, the first terminal T1 of the B2B diodes sub-circuit 14 is electrically connected by a metal interconnect 16 with the VSS1 terminal of the first device or sub-circuit 10, and the second terminal T2 of the B2B diodes sub-circuit 14 is electrically connected by a metal interconnect 18 with the power supply terminal VSS2 of the second device or sub-circuit 12. Advantageously, if static electrical charge is present in one or both of the electrical isolation regions 1, 2 creating an electrical potential difference between the electrical isolation regions 1, 2, then this static electric charge can conduct through whichever diode of the two diodes D1, D2 is forward biased by the electrical potential difference. For example, if the electrical isolation region 1 is at a positive voltage relative to the electrical isolation region 2, then an electric current will flow through the forward-biased diode D2 until the potential difference is eliminated. On the other hand, if the electrical isolation region 2 is at a positive voltage relative to the electrical isolation region 1, then an electric current will flow through the forward-biased diode D1 until the potential difference is eliminated. In either case, the electrostatic discharge does not pass through the devices or sub-circuits 10, 12, and the forward-biased diode can limit the electric current flow during the electrostatic discharge process in some embodiments. Thus, the electrostatic discharge event does not damage the circuitry 10, 12.

In the illustrative example of FIG. 1B, the B2B diodes sub-circuit 14 is connected between the VSS1 and VSS2 power supply terminals of the respective electrically isolated regions 1, 2. However, more generally, it may be effective to electrically connect the ESD protection sub-circuit 14 between power supply terminals of the same polarity of the first device or sub-circuit 10 and the second device or sub-circuit 12. For example, the connection may be between VDD1 and VDD2 in another embodiment. electrical ground corresponds to the negative supply voltage of the completed IC. As another example, the ESD protection sub-circuit may be connected between negative supply VEE terminals in the case of an IC-under-fabrication of a bipolar junction transistor (BJT) family.

With reference to FIG. 1C, after electrically connecting the ESD protection sub-circuit 14 as described with reference to FIG. 2, the first device or sub-circuit 10 and the second device or sub-circuit 12 can be electrically connected by an electrical interconnect 20, as shown in FIG. 1C. This can be done as a metallization layer deposition and patterning step of the BEOL processing that is performed after the metallization layer deposition and patterning step of the BEOL processing that produced the electrical interconnects 16, 18. For example, consider an example of BEOL processing in which N metallization layers are deposited and patterned to form a corresponding N layers of metal interconnects or traces, with each layer spaced apart from the adjacent layer or layers by intermetal dielectric (IMD) material. In this example, the electrical interconnects 16, 18 are produced as part of a metallization layer deposition/patterning step n (where $1 \le n < N$). Then, the electrical interconnect 20 may be produced as part of a subsequent metallization layer deposition/patterning step m (where $n < m \le N$).

Optionally, the metallization layer deposition/patterning step n may form other electrical interconnects of the IC besides the electrical interconnects 16, 18, and similarly the subsequent metallization layer deposition/patterning step m may optionally form other electrical interconnects of the IC besides the electrical interconnect 20.

To summarize, FIG. 1B diagrammatically depicts forming a first electrical interconnect layer disposed over the first, second, and third electrical isolation regions 1, 2, 3 and providing the electrostatic discharge protection by electrically connecting the first terminal T1 of the B2B diodes sub-circuit 14 with the VSS1 power supply terminal of the first device or sub-circuit 10 and electrically connecting the second terminal T2 of the B2B diodes sub-circuit 14 with the VSS2 power supply terminal of the second device or sub-circuit 12. FIG. 1C diagrammatically depicts forming a second electrical interconnect layer disposed over the first electrical interconnect layer and electrically connecting the first device or sub-circuit 10 and the second device or sub-circuit 12.

In the illustrative example of FIG. 1C, the first device or sub-circuit 10 and the second device or sub-circuit 12 are each CMOS logic inverters, and the electrical interconnection 20 connects an output of the CMOS logic inverter 10 with an input of the CMOS logic inverter 12. More generally, however, the electrical interconnection of the first device or sub-circuit 10 and the second device or sub-circuit 12 can entail any type of electrical interconnection between the two devices or sub-circuits. If there are two or more electrical interconnects between the first device or sub-circuit 10 and the second device or sub-circuit 12, then these do not necessarily need to be formed in the same metallization layer deposition/patterning step. That is, considering the previous example, the subsequent metallization layer deposition/patterning step m could be divided into two or more metallization steps $m_2, \ldots$, where $n < m_1 \leq N$ and $n < m_2 \leq N$ and so forth.

FIG. 1C can also be viewed as representing the final fabricated IC. As seen in FIG. 1C, the final IC includes the ESD protection sub-circuit 14 fabricated in the electrically isolated region 3 and connected with the electrically isolated regions 1 and 2 by way of interconnects 16, 18. In general, this does not adversely impact performance of the final IC, because during use of the IC the terminals VSS1 and VSS2 are at the same electrical potential, namely the potential $V_{SS}$ of the $V_{SS}$ pin of the IC power supply.

Moreover, the additional processing time to form the electrostatic discharge protection described with reference to FIGS. 1A, 1B, and 1C can be minimal or even zero. This is because the third electrical isolation region 3 can be fabricated in parallel with some other electrical isolation region (s) making up the functional circuitry of the IC. For example, the third electrical isolation region 3 can be fabricated in parallel with fabrication of the electrically isolated regions 1 and 2. Similarly, the diodes D1 and D2 of the B2B diodes sub-circuit 14 can be manufactured in parallel with p/n junctions of functional circuitry of the IC. Still further, as previously noted the metallization/patterning step of the BEOL processing forming the electrical interconnects 16, 18 can optionally also form electrical interconnects between functional regions of the IC (although not specifically the electrical interconnect 20 between functional devices or sub-circuits 10, 12, since the electrical interconnect 20 is formed after the electrical interconnects 16, 18 so that the electrostatic discharge protection is in place when the functional devices or sub-circuits 10, 12 to be protected are interconnected). In various embodiments, the electrical interconnects 16, 18 may comprise a metal layer, silicide and metal routing in metal-gate or FinFET or GAAFET processes, or so forth, as may be convenient for the IC fabrication process type and specific circuitry layout.

FIGS. 1A, 1B, and 1C depicts providing electrostatic discharge protection to protect against damage from electrostatic discharge between the illustrative electrically isolated regions 1 and 2. The approach can be generalized to provide protection against damage from electrostatic discharge between any two electrically isolated regions of an IC-under-fabrication, by providing an additional ESD protection sub-circuit 14 fabricated in the electrically isolated region 3 for each pair of regions to be protected, which is connected with the $V_{SS}$ terminals of that pair of electrically isolated regions. Based on circuit layout considerations, multiple unconnected electrically isolated regions 3 can also be formed to place the respective ESD protection sub-circuits at locations in the overall IC layout that are close to the functional electrically isolated regions to be protected without interfering with the functional circuitry layout.

Figure 2:
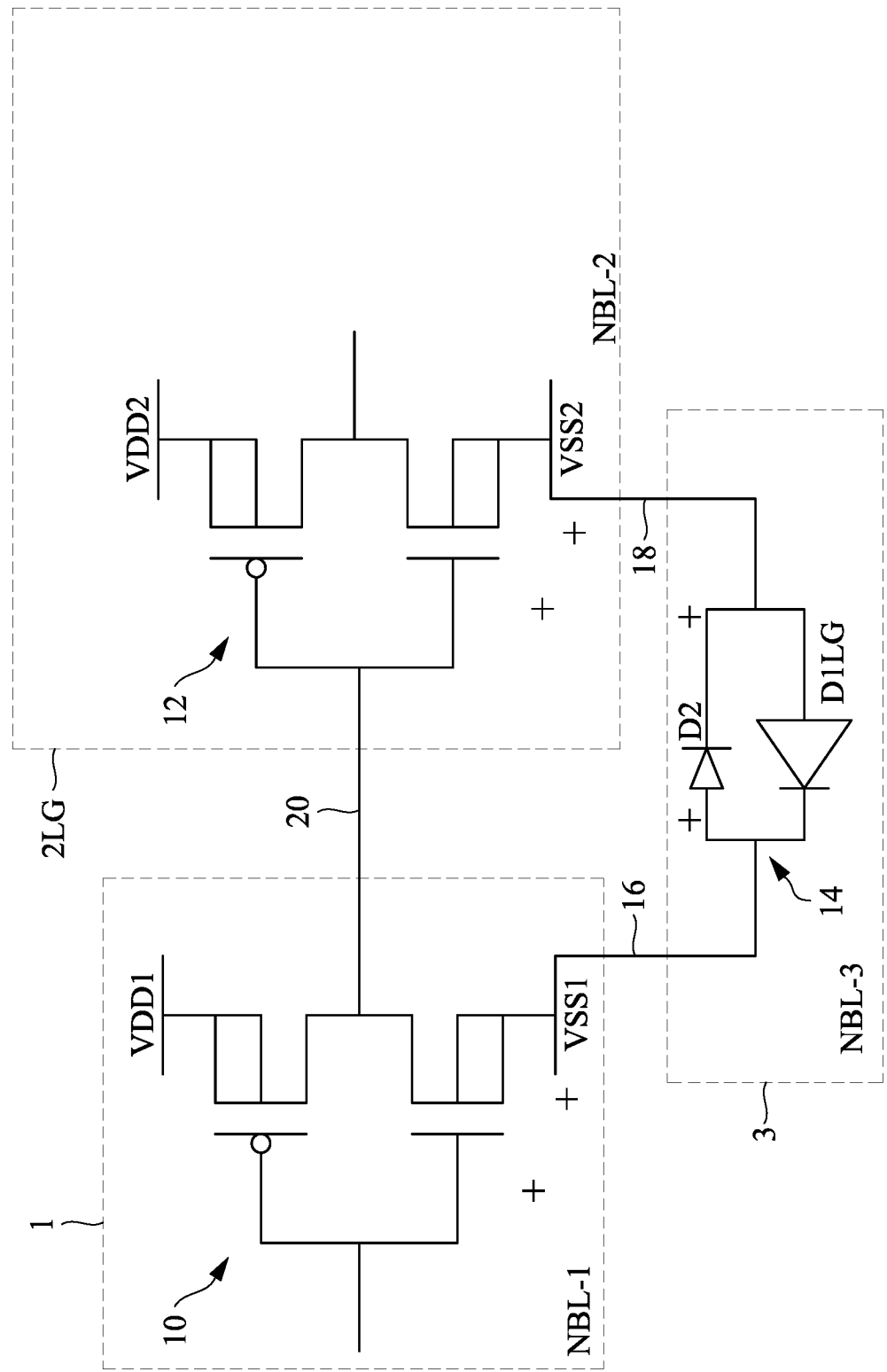
FIGS. 2 and 3 diagrammatically illustrate the IC-under-fabrication at the stage depicted in FIG. 1C for variant embodiments described herein.

With reference to FIG. 2, a variant embodiment is shown. FIG. 2 corresponds to the depiction of FIG. 1C of the IC-under-fabrication after formation of the interconnect 20 connecting the first and second devices or sub-circuits 10, 12. However, the example of FIG. 2 differs from that of FIG. 1C in that in the second electrically isolated region 2 of the example of FIG. 1C is replaced in the example of FIG. 2 by a larger-area second electrically isolated region 2LG. More specifically, the area (in the plane of the wafer) of the second electrically isolated region 2LG is larger than the area of the first electrically isolated region 1. Due to the larger size of the second electrically isolated region 2LG, it may be expected that the second electrically isolated region 2LG may accumulate more static electrical charge during FEOL processing. As a consequence, an electrostatic discharge from second electrically isolated region 2LG to the first electrically isolated region 1 may be reasonably expected to be larger than an electrostatic discharge in the reverse direction. To accommodate this possibility, in the embodiment of FIG. 2 the B2B diodes sub-circuit 14 is modified to include a diode D1LG which has a larger junction area than the junction area of the diode D2. To generalize the variant of FIG. 2, an area of the second electrical isolation region 2LG is larger than an area of the first isolation region 1, and a junction area of the first diode D1LG is larger than a junction area of the second diode D2.

Figure 3:
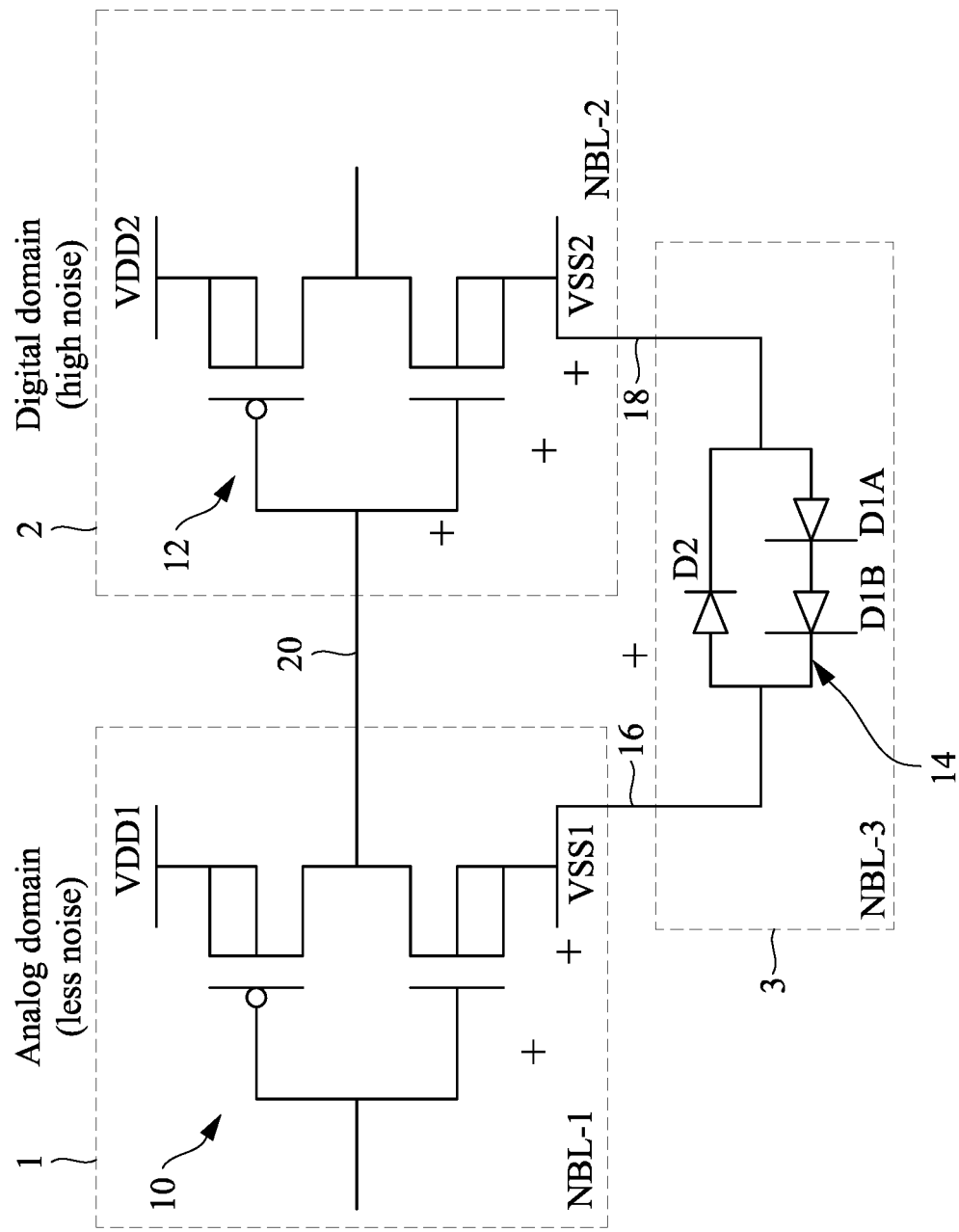

With reference to FIG. 3, another variant embodiment is shown. FIG. 3 corresponds to the depiction of FIG. 1C of the IC-under-fabrication after formation of the interconnect 20 connecting the first and second devices or sub-circuits 10, 12. However, in the example of FIG. 3 it is assumed that the two electrically isolated regions 1 and 2 are asymmetric from a noise generation perspective. Specifically, in this example the first electrically isolated region 1 is assumed to contain analog circuitry, e.g. the first device or sub-circuit 10 is assumed to be an analog circuit (or part of an analog circuit); while the second electrically isolated region 2 is assumed to contain digital circuitry, e.g. the second device or sub-circuit 12 is assumed to be a digital circuit (or part of a digital circuit). In many cases, digital circuitry produces more noise than analog circuitry, and/or the analog circuitry is more sensitive to noise than the digital circuitry. To mitigate noise transfer from the digital region 2 to the analog region 1, the ESD protection circuit 14 of the embodiment of FIG. 3 replaces the single diode D1 of the example of FIG. 1C with two diodes MA and D1B electrically connected in series. More generally, the first diode D1 may be replaced by at least two diodes D1A, D1B electrically connected in series. Additional or other noise transfer suppression techniques could also be used, such as incorporating a tuned noise rejection filter into the ESD protection circuit 14 if the frequency range of expected noise generation is known a priori (as is usually the case in IC circuit design).

Figure 4:
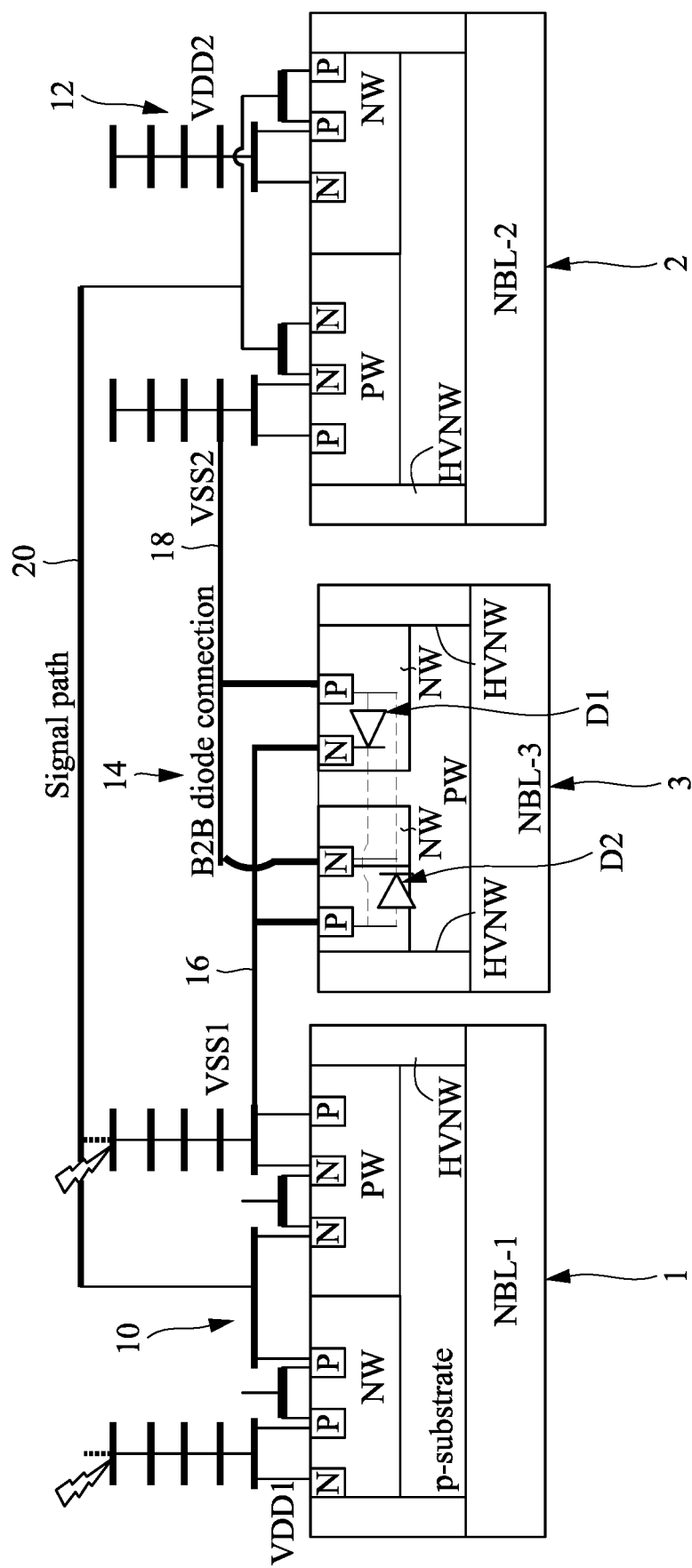
FIGS. 4, 5, and 6 diagrammatically illustrate various embodiments of the IC-under-fabrication as shown in FIG. 1C in diagrammatic side sectional view.
Figure 5:
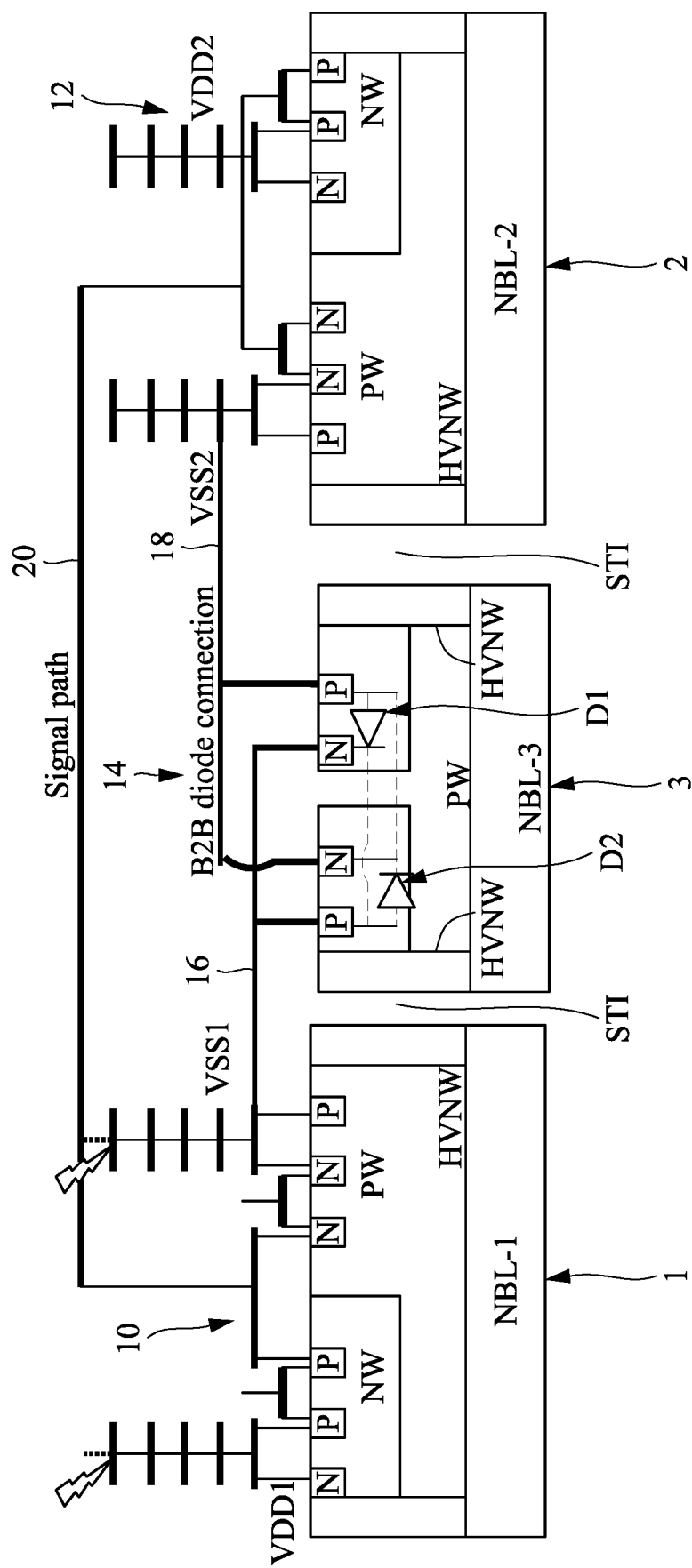
Figure 6:
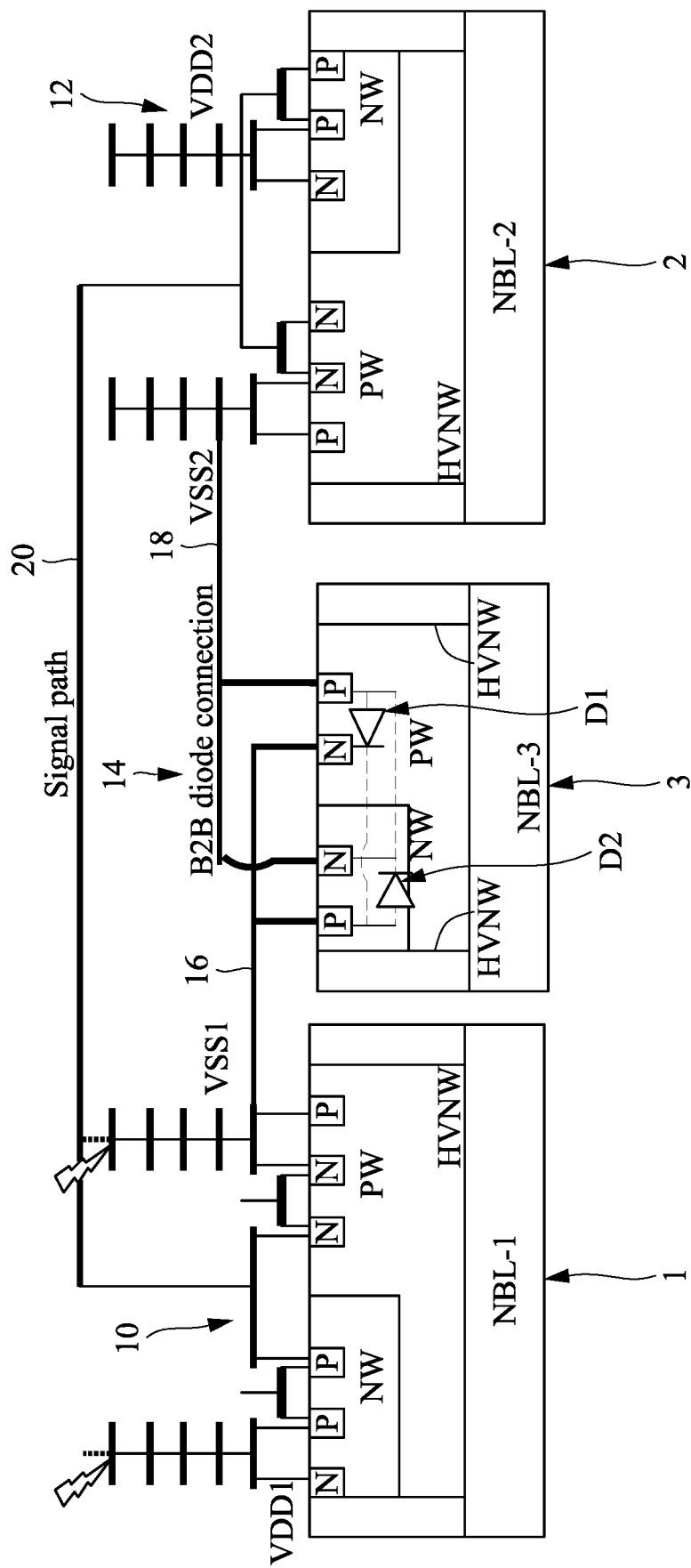

With reference now to FIGS. 4, 5, and 6, the IC-under-fabrication as shown in FIG. 1C is shown in diagrammatic side sectional view. In each of FIGS. 4, 5, and 6, the electrically isolated regions 1, 2, and 3 are shown in side-sectional view showing the n-type buried layer (NBL-1 for region 1, NBL-2 for region 2, and NBL-3 for region 3), with lateral isolation provided by high-voltage N-well (HVNW) regions. Also diagrammatically shown are the electrical interconnects 16, 18 of the B2B diodes sub-circuit 14 with VSS1 and VSS2, respectively, and the electrical interconnect 20 between the first device or sub-circuit 10 formed in the electrically isolated region 1 and the second device or sub-circuit 12 formed in the electrically isolated region 2. FIGS. 4, 5, and 6 illustrate three non-limiting illustrate examples of how the B2B diodes sub-circuit 14 may be fabricated. In general, in FIGS. 4, 5, and 6 "PW" indicates a p-type well and "NW" indicates an n-type well.

FIG. 4 illustrates an example in which each of diode D1 and diode D2 of the B2B diodes sub-circuit 14 is formed as a $P^+$ region disposed in an n-type well. The two n-type wells (NW) are in turn disposed in a p-type well (PW) that is electrically isolated by NBL-3 and the HVNW regions. The depths of NWs and PWs may be individually adjusted for different product designs and based on the maximum amount of electrostatic discharge that is credibly anticipated. For example the depths of NWs and PWs may be different in some embodiments. Moreover, diodes D1 and D2 may be implemented in the respective NWs in various ways, such as using diodes of different sizes as previously described with reference to FIG. 2, and/or with one or both diodes implemented as two or more series-connected diodes as previously described with reference to FIG. 3.

FIG. 5 illustrates an example in which each of diode D1 and diode D2 of the B2B diodes sub-circuit 14 is formed as an $N^+$ region disposed in a p-type well that is electrically isolated by NBL-3 and the HVNW regions.

FIG. 6 illustrates an example in which is a combination of the approaches of FIGS. 4 and 5, in which one of the diodes of the B2B diodes sub-circuit 14 is formed as a $P^+$ region disposed in an n-type well, and the other of the diodes is formed as an $N^+$ region disposed in a p-type well.

FIGS. 7, 8, 9, 10, 11, and 12 diagrammatically illustrate some suitable layouts of the diodes D1 and D2 of the B2B diodes sub-circuit, which may be suitably used in various embodiments described herein. Each of FIGS. 7-12 depicts the diodes D1 and D2 fabricated in the third electrical isolation area 3, shown in plan view.

Figure 7:
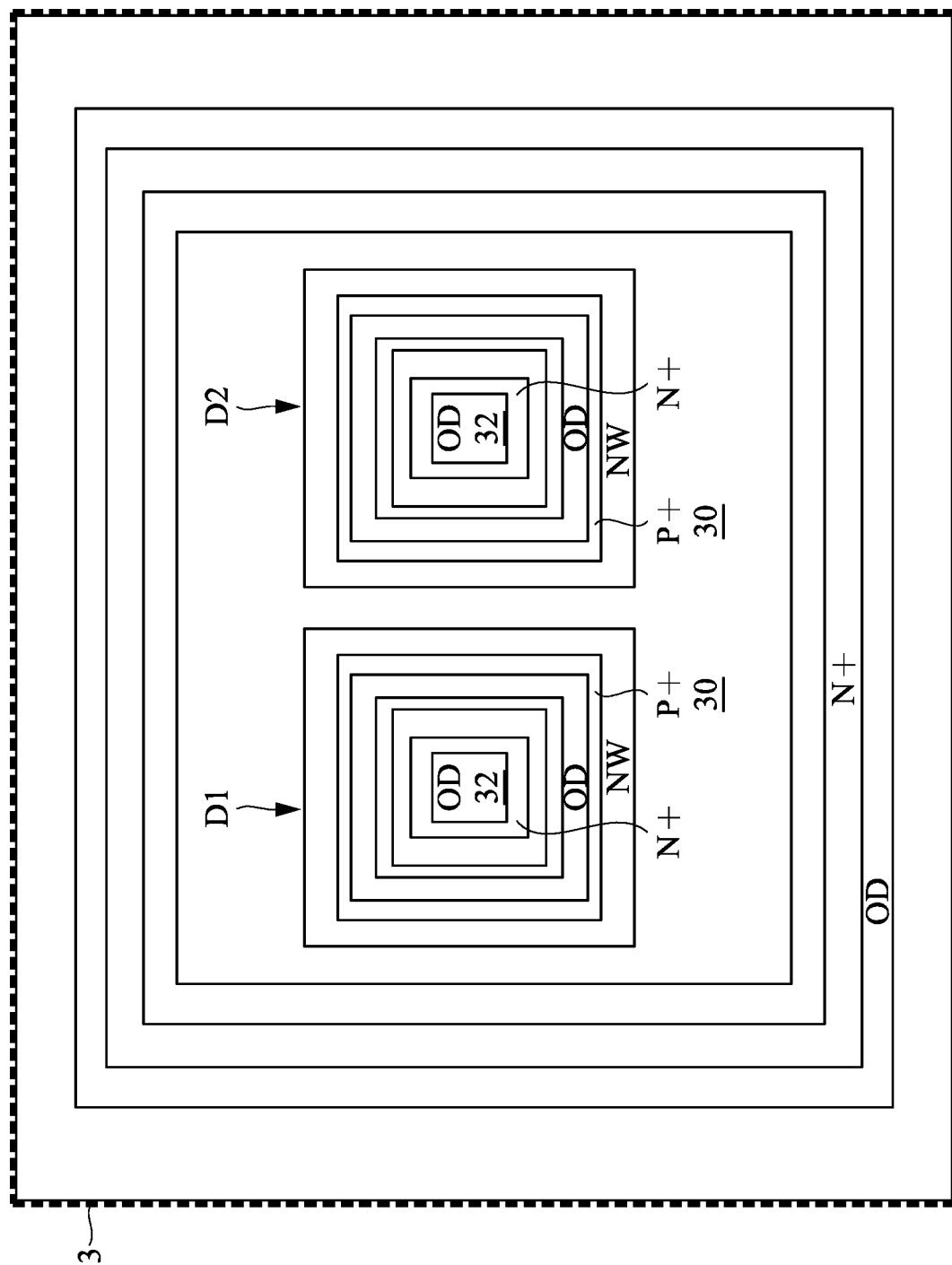
FIGS. 7, 8, 9, 10, 11, and 12 diagrammatically illustrate embodiments of a back-to-back (B2B) diodes sub-circuit suitably used in other embodiments described herein, shown in plan-view.

FIG. 7 depicts both diodes D1 and D2 fabricated as a $P^+$/NW structure in which the $P^+$ region of each diode is in the form of a ring 30 surrounding a central $N^+$ region 32.

Figure 8:
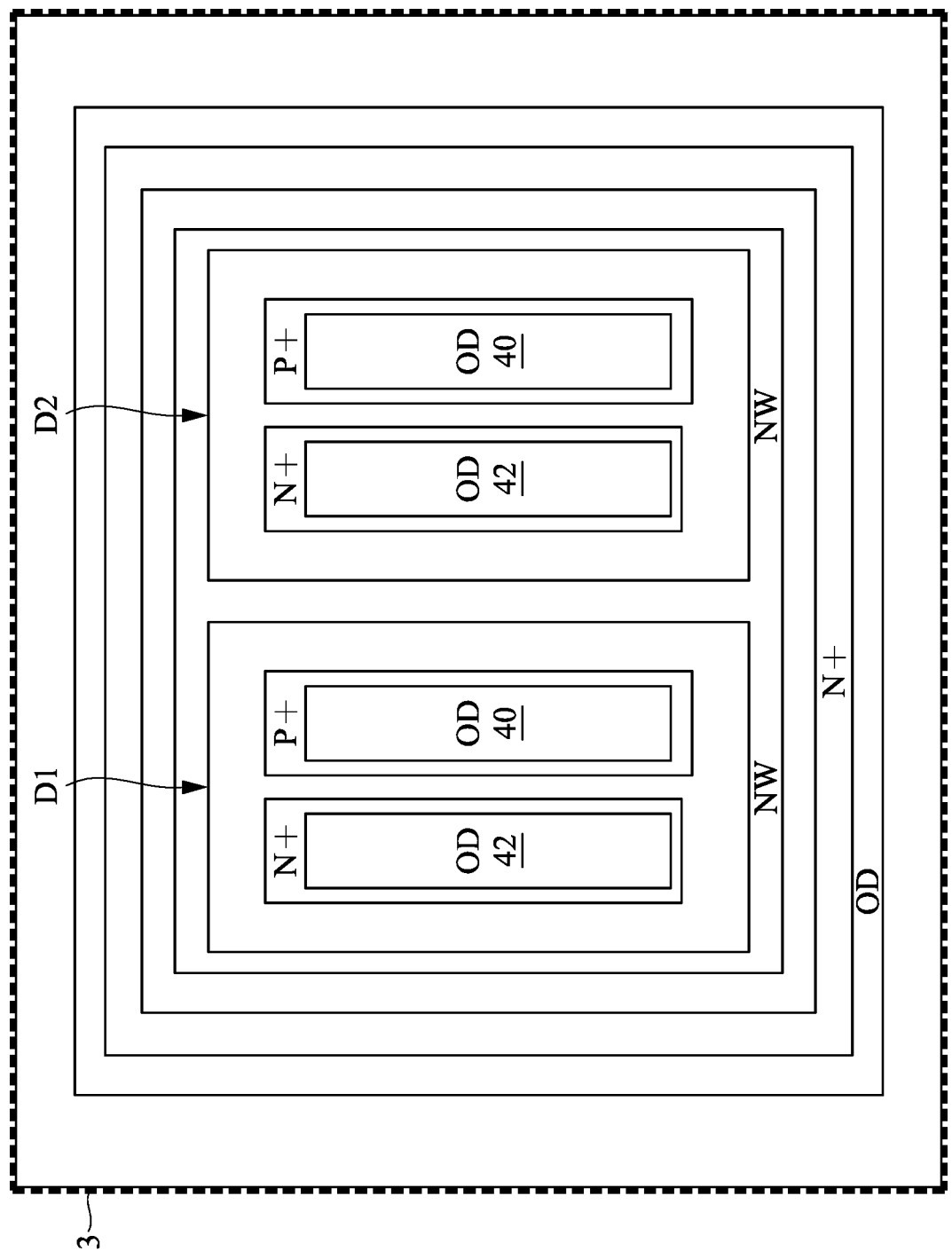

FIG. 8 depicts both diodes D1 and D2 fabricated as a $P^+$/NW structure in which the $P^+$ region 40 of each diode is in the form of a stripe and the $N^+$ region 42 is also in the form of a parallel stripe.

Figure 9:
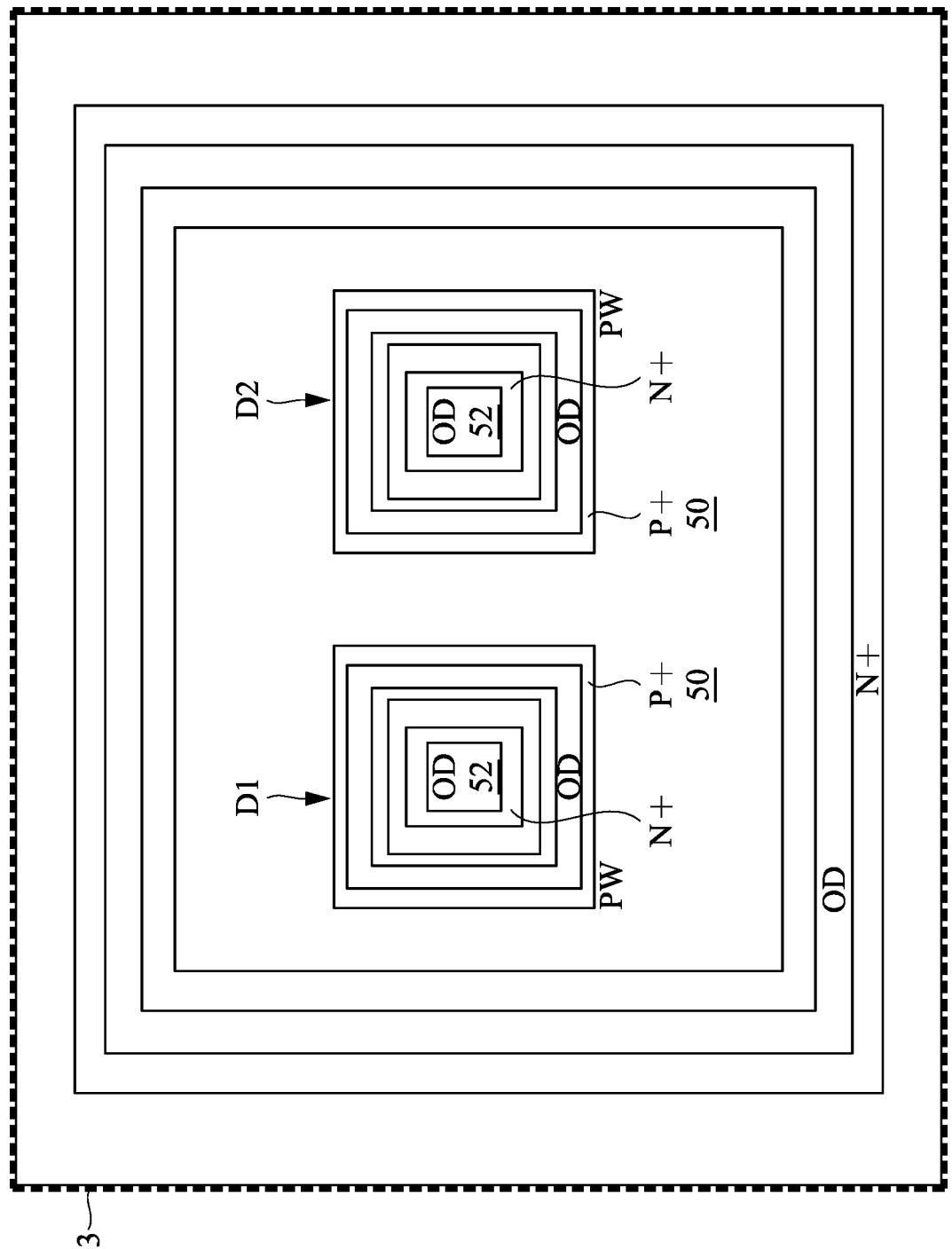

FIG. 9 depicts both diodes D1 and D2 fabricated as a $P^+$/PW structure in which the $P^+$ region of each diode is in the form of a ring 50 surrounding a central $N^+$ region 52.

Figure 10:
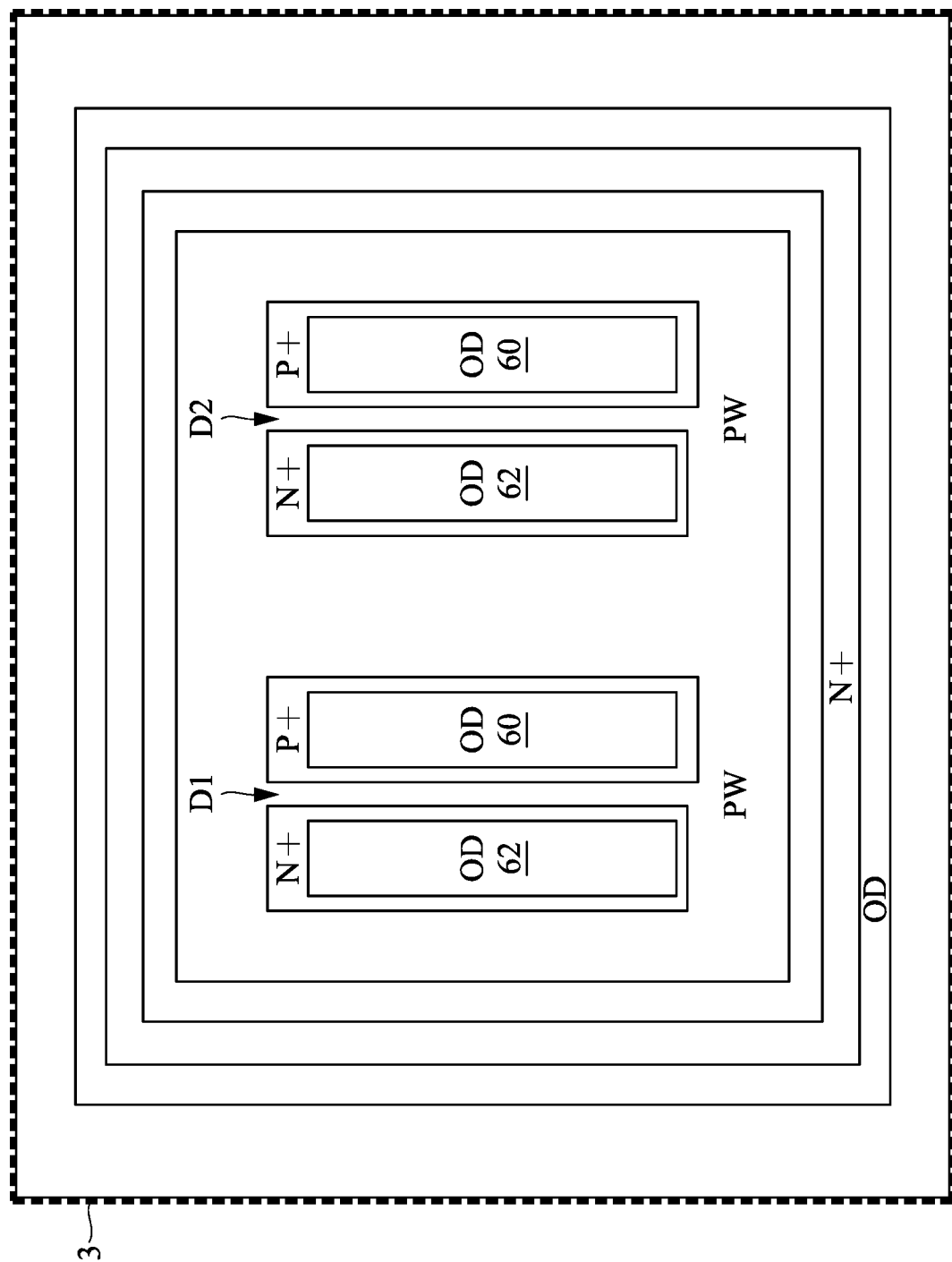

FIG. 10 depicts both diodes D1 and D2 fabricated as an $P^+$/PW structure in which the $P^+$ region 60 of each diode is in the form of a stripe and the $N^+$ region 62 is also in the form of a parallel stripe.

Figure 11:
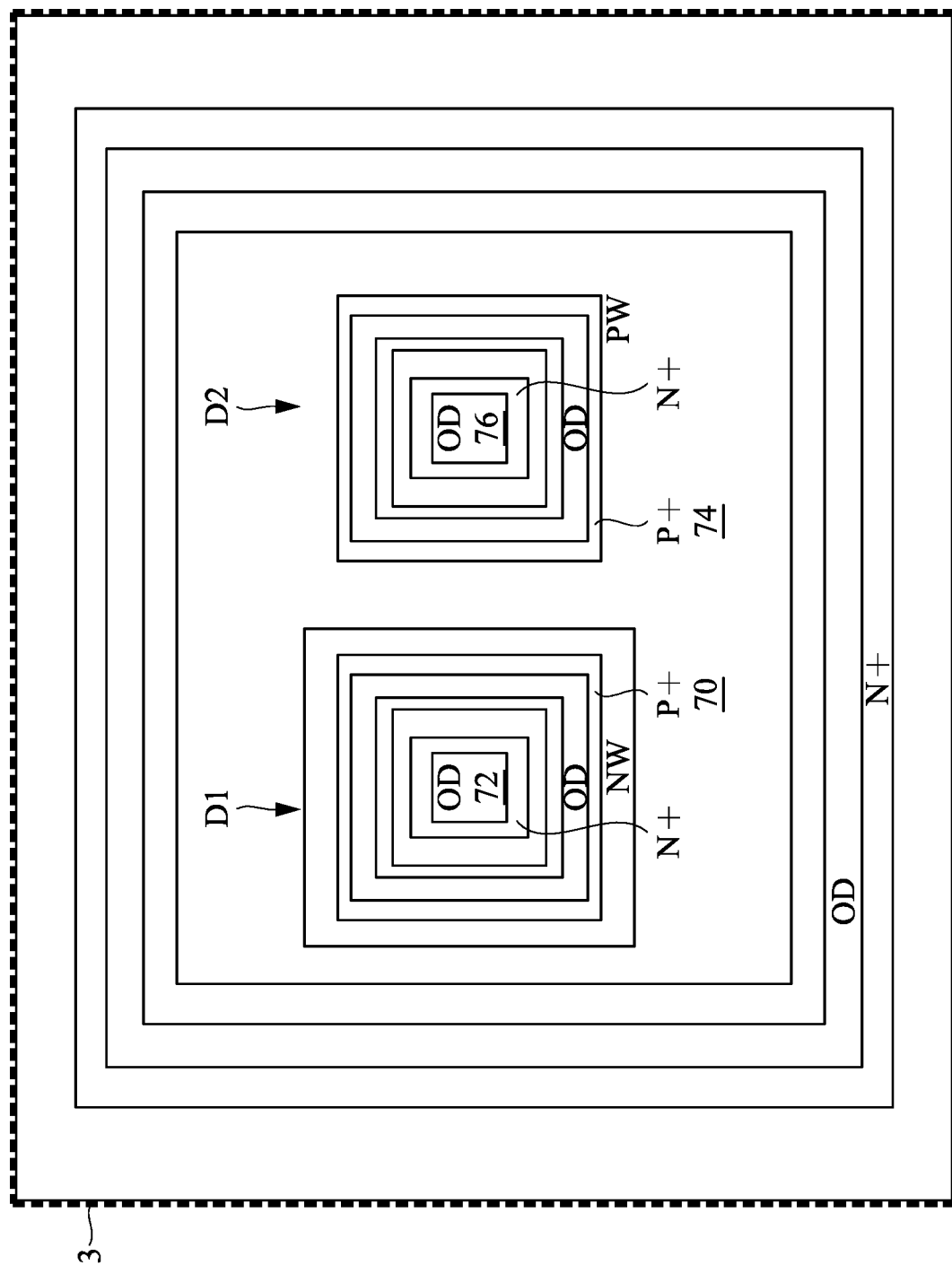

FIG. 11 depicts diode D1 fabricated as a $P^+$/NW structure in which the $P^+$ region is in the form of a ring 70 surrounding a central $N^+$ region 72, and diode D2 fabricated as an $N^+$/PW structure in which the $P^+$ region is in the form of a ring 74 surrounding a central $N^+$ region 76.

Figure 12:
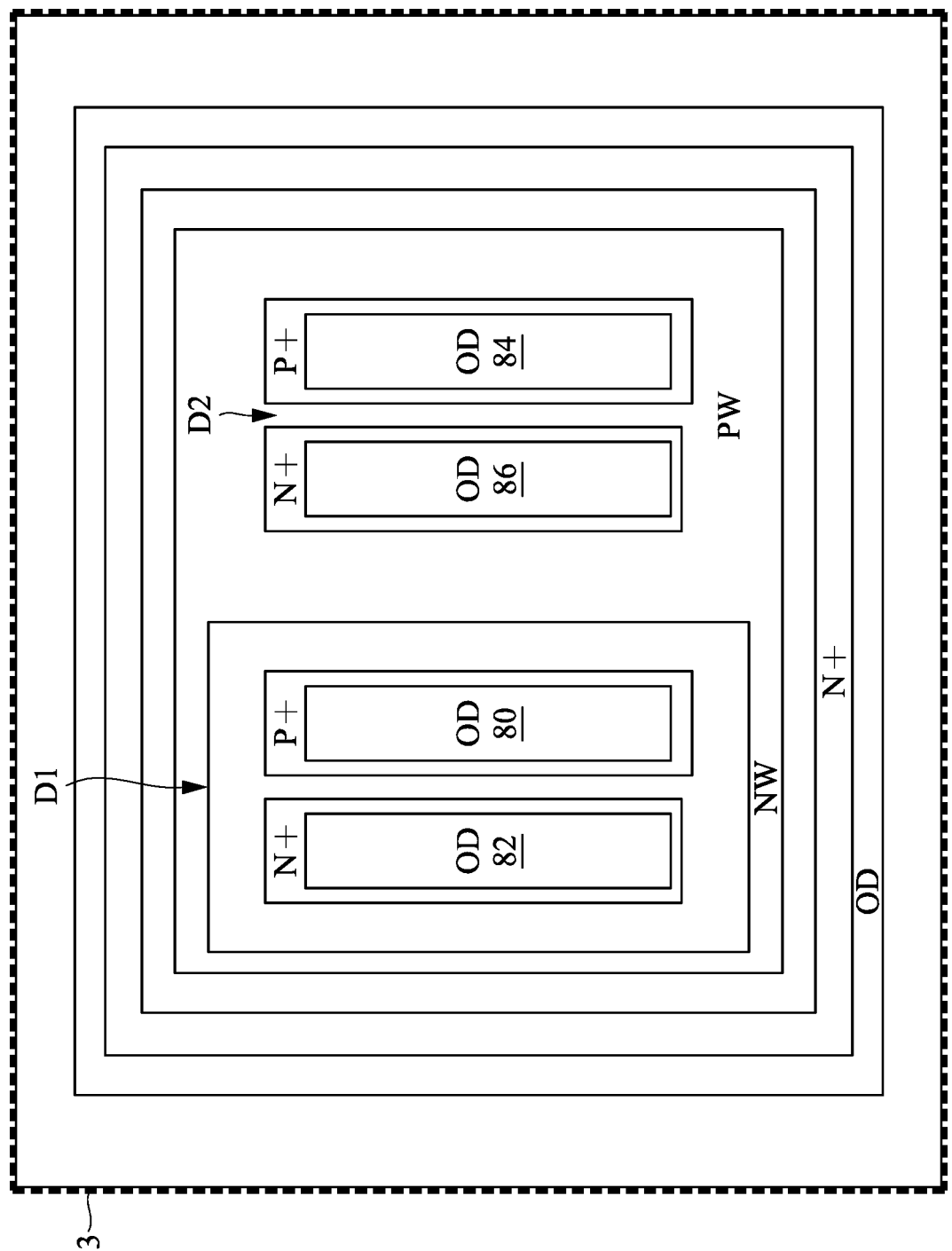

FIG. 12 depicts diode D1 fabricated as a $P^+$/NW structure in which the $P^+$ region is in the form of a stripe 80 and the $N^+$ region 82 is also in the form of a parallel stripe, and diode D2 fabricated as an $N^+$/PW structure in which the $P^+$ region is in the form of a stripe 84 and the $N^+$ region 86 is also in the form of a parallel stripe.

It will be appreciated that FIGS. 4-12 illustrate examples of some suitable physical implementations of the B2B diodes sub-circuit 14 and components thereof. Other physical implementations are also contemplated for the B2B diodes sub-circuit 14 and components thereof. Moreover, as previously noted, the ESD protection sub-circuit 14 could comprise other types of circuit elements besides diodes, such as resistors, transistors, or various combinations thereof.

In the following, some additional illustrative embodiments are disclosed.

In some illustrative embodiments, an IC fabrication process comprises: forming a first electrical isolation region and a second electrical isolation region and a third electrical isolation region; forming a first device or sub-circuit in the first electrical isolation region; forming a second device or sub-circuit in the second electrical isolation region; forming an electrostatic discharge (ESD) protection sub-circuit in the third electrical isolation region; electrically connecting the ESD protection sub-circuit between power supply terminals of the same polarity of the first device or sub-circuit and the second device or sub-circuit; and after electrically connecting the ESD protection sub-circuit, electrically connecting the first device or sub-circuit and the second device or sub-circuit.

In some illustrative embodiments of an IC fabrication process as set forth in the immediately preceding paragraph, the ESD protection sub-circuit comprises a back-to-back diodes sub-circuit having a first terminal and a second terminal, and including: a first diode whose cathode is connected with the first terminal and whose anode is connected with the second terminal; and a second diode whose anode is connected with the first terminal and whose cathode is connected with the second terminal. In these illustrative embodiments, the electrical connecting of the ESD protection sub-circuit between power supply terminals of the same polarity of the first device or sub-circuit and the second device or sub-circuit includes: electrically connecting the first terminal of the back-to-back diodes sub-circuit with the power supply terminal of the first device or sub-circuit, and electrically connecting the second terminal of the back-to-back diodes sub-circuit with the power supply terminal of the second device or sub-circuit.

In some illustrative embodiments, an IC comprises: a first electrical isolation region; a second electrical isolation region; a third electrical isolation region; a first device or sub-circuit disposed in the first electrical isolation region; a second device or sub-circuit disposed in the second electrical isolation region; an electrostatic discharge (ESD) protection sub-circuit disposed in the third electrical isolation region; a first electrical interconnect layer disposed over the first, second, and third electrical isolation regions and electrically connecting the ESD protection sub-circuit between power supply terminals of the same polarity of the first device or sub-circuit and the second device or sub-circuit; and a second electrical interconnect layer disposed over the first electrical interconnect layer and electrically interconnecting the first device or sub-circuit and the second device or sub-circuit.

In some illustrative embodiments, an IC fabrication process comprises: forming a first electrical isolation region; forming a second electrical isolation region; forming a third electrical isolation region; fabricating a first device or sub-circuit in the first electrical isolation region; fabricating a second device or sub-circuit in the second electrical isolation region; and fabricating a back-to-back diodes sub-circuit in the third electrical isolation region. The back-to-back diodes sub-circuit has a first terminal and a second terminal and includes a first diode whose cathode is connected with the first terminal and whose anode is connected with the second terminal and a second diode whose anode is connected with the first terminal and whose cathode is connected with the second terminal. The IC fabrication process further comprises: providing electrostatic discharge protection by electrically connecting the first terminal of the back-to-back diodes sub-circuit with a $V_{SS}$ power supply terminal of the first device or sub-circuit and electrically connecting the second terminal of the back-to-back diodes sub-circuit with a $V_{SS}$ power supply terminal of the second device or sub-circuit; and after providing the electrostatic discharge protection, electrically connecting the first device or sub-circuit and the second device or sub-circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a first electrical isolation region;
a second electrical isolation region;
a third electrical isolation region;
a first device or sub-circuit disposed in the first electrical isolation region;
a second device or sub-circuit disposed in the second electrical isolation region;
an electrostatic discharge (ESD) protection sub-circuit disposed in the third electrical isolation region;
wherein the ESD protection sub-circuit is electrically connected between power supply terminals of the same polarity of the first device or sub-circuit and the second device or sub-circuit; and
wherein the first device or sub-circuit and the second device or sub-circuit are electrically interconnected.

2. The IC of claim 1 wherein the ESD protection sub-circuit comprises a resistor.

3. The IC of claim 1 wherein the ESD protection sub-circuit comprises a transistor.

4. The IC of claim 1 wherein the ESD protection sub-circuit comprises a Zener diode.

5. The IC of claim 1 further comprising:
a stack of patterned metallization layers electrically interconnecting the ESD protection sub-circuit between the power supply terminals of the same polarity of the first device or sub-circuit and the second device or sub-circuit and electrically interconnecting the first device or sub-circuit and the second device or sub-circuit.

6. The IC of claim 5 wherein:
the first, second, and third electrical isolation regions are formed in a substrate and the stack of patterned metallization layers is disposed on the substrate;
a first patterned metallization layer of the stack of patterned metallization layers electrically interconnects the ESD protection sub-circuit between the power supply terminals of the same polarity of the first device or sub-circuit and the second device or sub-circuit;

a second patterned metallization layer of the stack of patterned metallization layers electrically interconnects the first device or sub-circuit and the second device or sub-circuit; and
the first patterned metallization layer is disposed closer to the substrate than the second patterned metallization layer in the stack of patterned metallization layers.

7. An electrostatic discharge (ESD) protection device comprising:
an ESD protection sub-circuit disposed in an electrical isolation region of an integrated circuit (IC); and
electrical interconnects connecting the ESD protection sub-circuit between power supply terminals of the same polarity of first and second devices or sub-circuits of the IC which are disposed in respective first and second electrical isolation regions of the IC.

8. The ESD protection device of claim 7 wherein the first and second electrical isolation regions are different from each other and are different from the electrical isolation region in which the ESD protection sub-circuit is disposed.

9. The ESD protection device of claim 7 wherein the ESD protection sub-circuit comprises a resistor.

10. The ESD protection device of claim 7 wherein the ESD protection sub-circuit comprises a transistor.

11. The ESD protection device of claim 7 wherein the ESD protection sub-circuit comprises a Zener diode.

12. The ESD protection device of claim 7 wherein the electrical interconnects comprise electrical interconnects of patterned metallization layers disposed over the ESD protection sub-circuit.

13. The ESD protection device of claim 7 wherein:
the electrical interconnects comprise electrical interconnects of a first patterned metallization layer of a stack of patterned metallization layers disposed over the ESD protection sub-circuit; and
the stack of patterned metallization layers further includes a second patterned metallization layer interconnecting the first and second devices or sub-circuits of the IC; and
the second patterned metallization layer is located further away from the ESD protection sub-circuit in the stack of patterned metallization layers than the first patterned metallization layer.

14. An electrostatic discharge (ESD) protection method comprising:
forming an ESD protection sub-circuit in an electrical isolation region of an integrated circuit (IC); and
electrically connecting the ESD protection sub-circuit between power supply terminals of the same polarity of first and second devices or sub-circuits of the IC which are disposed in respective first and second electrical isolation regions of the IC.

15. The ESD protection method of claim 14 wherein the respective first and second electrical isolation regions of the IC are different from each other and are different from the electrical isolation region in which the ESD protection sub-circuit is disposed.

16. The ESD protection method of claim 14 wherein the ESD protection sub-circuit comprises a resistor.

17. The ESD protection method of claim 14 wherein the ESD protection sub-circuit comprises a transistor.

18. The ESD protection method of claim 14 wherein the ESD protection sub-circuit comprises a Zener diode.

19. The ESD protection method of claim 14 further comprising:
after electrically connecting the ESD protection sub-circuit between the power supply terminals of the same polarity of the first and second devices or sub-circuits of the IC, electrically connecting the first and second devices or sub-circuits of the IC.

20. The ESD protection method of claim 19 wherein:

the electrical connecting of the ESD protection sub-circuit between the power supply terminals of the same polarity of the first and second devices or sub-circuits of the IC comprises forming a first patterned metallization layer of back end-of-line (BEOL) processing including traces providing the electrical connecting of the ESD protection sub-circuit between the power supply terminals of the same polarity of the first and second devices or sub-circuits of the IC;

the electrical connecting of the first and second devices or sub-circuits of the IC comprises forming a second patterned metallization layer of the BEOL processing including traces providing the electrical connecting of the first and second devices or sub-circuits of the IC;

wherein the second patterned metallization layer is formed later in the BEOL processing than the first pattern metallization processing.

* * * * *